United States Patent
Feldman et al.

(10) Patent No.: US 7,139,967 B2
(45) Date of Patent: Nov. 21, 2006

(54) CONVOLUTIONAL DECODING

(75) Inventors: Jon Feldman, Cambridge, MA (US); Matteo Frigo, Cambridge, MA (US); Ibrahim Abou-Faycal, Cambridge, MA (US)

(73) Assignee: Vanu, Inc., Cambridge, MA (US)

( * ) Notice: Subject to any disclaimer, the term of this patent is extended or adjusted under 35 U.S.C. 154(b) by 394 days.

(21) Appl. No.: 10/639,881

(22) Filed: Aug. 13, 2003

(65) Prior Publication Data

US 2004/0153957 A1   Aug. 5, 2004

Related U.S. Application Data

(60) Provisional application No. 60/403,181, filed on Aug. 13, 2002.

(51) Int. Cl.
H03M 13/41   (2006.01)
H03M 13/39   (2006.01)

(52) U.S. Cl. .................... 714/794; 714/795

(58) Field of Classification Search ............... 714/786, 714/791, 794, 795
See application file for complete search history.

(56) References Cited

U.S. PATENT DOCUMENTS

| | | | | |
|---|---|---|---|---|
| 5,901,182 A * | 5/1999 | Kot | ................... | 375/341 |
| 6,154,507 A * | 11/2000 | Bottomley | .......... | 375/340 |
| 6,356,911 B1 * | 3/2002 | Shibuya | ............. | 707/101 |
| 6,490,327 B1 * | 12/2002 | Shah | ................... | 375/341 |
| 6,788,750 B1 * | 9/2004 | Reuven et al. | ....... | 375/341 |

OTHER PUBLICATIONS

Cormen et al., 2001, Introduction to Algorithms Second Edition, McGraw-Hill, Boston.

Ekroot, L. and Dolinar, S., "A * Decoding of Block Codes", *IEEE Transactions on Communications*, vol. 44 (9):1052-1056 (1996).

Fano, "A Heuristic Discussion of Probabilistic Decoding", *IEEE Transactions on Information Theory*, vol. IT9(1):64-74 (1963).

Forney, Jr., "Convolutional Codes II. Maximum-Likelihood Decoding", *Information and Control*, vol. 25:222-266 (1974).

Forney, Jr., "The Viterbi Algorithm", *Proceedings of the IEEE*, vol. 61(3):268-278 (1973).

Han et al., "Efficient Priority-First Search Maximum-Likelihood Soft-Decision Decoding of Linear Block Codes", *IEEE Transactions on Information Theory*, vol. 39(5):1514-1523 (1993).

Han et al., "A Maximum-Likelihood Soft-Decision Sequential Decoding Algorithm for Binary Convolutional Codes", *IEEE Transactions on Communications*, vol. 50(2):173-178 (2002).

Heller, J. and Jacobs, I. M., "Viterbi Decoding for Satellite and Space Communication", *IEEE Transactions on Communication Technology*, vol. Com-19(5):835-848 (1971).

Kang, G. and Zhang, P., "The Implementation of Viterbi Decoder on TMS320C6201 DSP in WCDMA System", *Beijing University of Posts and Telecommunications*.

Rajagopal, S., "A Real-Time Baseband Communications Processor for High Data Rate Wireless Systems", Dept. of Electrical and Computer Engineering, Rice University (2002).

(Continued)

*Primary Examiner*—Stephen M. Baker
(74) *Attorney, Agent, or Firm*—Fish & Richardson P.C.

(57) ABSTRACT

In one aspect the invention is a method for sequence estimating. The method includes receiving convolutional codes. The method further includes using a lazy Viterbi decoder to decode the convolutional codes. The convolutional codes may be stream convolutional codes. The convolutional codes may also be block convolutional codes. The lazy Viterbi decoder may be used in a software radio environment.

21 Claims, 2 Drawing Sheets

OTHER PUBLICATIONS

Sereni et al., "A Software Re-Configurable Architecture for 3G and Wireless Systems", University of Perugia, Italy (2000).

Varga, R. and Harrison, M. (eds), The Art of Computer Programming-Second Edition, Addison-Wesley, Massachusetts (1973).

Viterbi, "Error Bounds for Convolutional Codes and an Asymptotically Optimum Decoding Algorithm", *IEEE Transactions on Information Theory*, vol. IT-13(2):260-269 (1967).

Wicker, S. B., Error Control Systems for Digital Communication and Storage, Prentice Hall, Englewood Cliffs, NJ (1995).

International Search Report—PCT/US03/25218.

* cited by examiner

CONVOLUTIONAL DECODING

PRIORITY TO OTHER APPLICATIONS

This application claims priority from and incorporates herein U.S. Provisional Application No. 60/403,181, filed Aug. 13, 2002, and titled "A FAST MAXIMUM-LIKELIHOOD DECODER FOR CONVOLUTIONAL CODES".

BACKGROUND OF THE INVENTION

In a typical communications system, a transmitter sends an information stream over a channel to a receiver. Typically, not all of the information stream sent by the transmitter is received by the receiver due to interference in the channel. In other situations, the information stream is distorted due to the information stream bouncing off or passing through additional mediums and received by the receiver after the primary information stream was received (phase distortion) or with less intensity (amplitude distortion).

Convolutional encoding is used to build redundancy into a data stream to detect errors and to correct errors caused by interference in the channel or distortion in the information stream. Convolutional codes have the advantage of being reliable, efficient, and able to handle high data-rate communications through low bandwidth channels.

One known method of estimating the sequence of convolutionally encoded symbols transmitted over a channel is through a Viterbi decoder. The Viterbi decoder keeps track of all the possible information streams, and outputs an information stream that is the most likely information stream sent by a sender. The Viterbi decoder uses a trellis. The trellis is a dynamic programming table whose entries are indexed by (t,s), where t is a time step and s is a state. The Viterbi decoder is limited in the time steps by a traceback length, L. At each time step, the Viterbi decoder outputs the (t−L)-th bit of the most likely information stream at time step, t, after at least L bits have been received.

Another method of decoding a convolutional code uses a sequential decoder, such as a Fano decoder or a Stack decoder, or a A* decoder. The Fano and Stack decoders search a tree, instead of the trellis, for all the possible decoder state sequences over a fixed length sequence of information symbols. The tree has the same type of states and transitions as the trellis; however, the tree has $2^t$ nodes, where t is time. Each node represents a unique state transition path from the root. The tree is not necessarily stored explicitly, but searched implicitly via some heuristic. An error metric is used and once a leaf of the tree is found that has a good error metric, the entire path leading to that leaf is outputted. The particular error metric and search strategy chosen make one sequential decoder different from another sequential decoder. The Fano and Stack decoders use an error metric that depends not only on the received symbols and the true bits of the transition, but also on the tree level of the node being expanded. In other words, the closer the node is to a leaf of the tree, the fewer errors are likely to be introduced.

Under good Signal-to-Noise Ratio (SNR) conditions, sequential decoders are more computationally efficient than the Viterbi decoder, but, in addition to being suboptimal in terms of detection performance, they become prohibitively slow at low SNR. The A* decoder combines the reliability and performance of the Viterbi decoder while running as efficiently as a sequential decoder when the SNR is high.

The transmission of data often requires that an equalizer be incorporated in the receiver to correct for the distortions produced by the transmission medium. These distortions can include effects such as amplitude variations and multi-path propagation. Sequence estimation is used in equalizers to correct for certain types of distortions, such as inter-symbol interference. Equalizers typically employ the same methods for sequence estimation (i.e., Viterbi, Stack and Fano) as are used for the decoding of convolutional codes.

It is an important object of the invention to provide improved recovery of information from a received signal having both desired and undesired information.

BRIEF SUMMARY OF THE INVENTION

In one aspect the invention is a method for decoding convolutional codes. The method includes receiving convolutional codes and using a lazy Viterbi decoder to decode the convolutional codes.

In another aspect of the invention, an apparatus for decoding convolutional codes includes a memory that stores executable instruction signals and a processor. The processor executes instruction signals to receive convolutional codes and to use a lazy Viterbi decoder to decode the convolutional codes.

In a still further aspect, an article includes a machine-readable medium that stores executable instruction signals for decoding convolutional codes. The instruction signals cause a machine to receive convolutional codes and to use a lazy Viterbi decoder to decode the convolutional codes.

One or more of the aspects above may have one or more of the following features. The convolutional codes may include block convolutional codes. The convolutional codes may include stream convolutional codes. The lazy Viterbi decoder may be used in a software radio environment. Using the lazy Viterbi decoder may include initializing a trellis data structure and a priority queue data structure and extracting a lowest-metric shadow node û in the priority queue until a "real" version u of û is not already in the trellis data structure. Using the lazy Viterbi decoder may also include inserting the node u into the trellis data structure and for all successors of u' of u, generating a new shadow node û' with a corresponding accumulated metric. Using the lazy Viterbi decoder may include inserting the new shadow node û' into the priority queue and a time list.

In another aspect, a receiver includes a lazy Viterbi decoder. The receiver may be in a software radio environment. The receiver may be in a high-definition television. The receiver may include a transceiver and the transceiver may include the receiver. The receiver may include an integrated circuit and the integrated circuit includes the lazy Viterbi decoder.

The decoder described herein, a "lazy Viterbi decoder", has advantages that include a maximum-likelihood decoding; a best-case running time which is better than the Viterbi decoder; a worst-case asymptotic running time that is no worse than for the Viterbi decoder; and simple data structures that allow for an efficient software implementation. The decoder described herein can be implemented in a number of embodiments, including a software radio, a high-definition television, a global system for mobile (GSM) communications. Further, the "lazy Viterbi decoder" can be implemented in integrated circuits (ICs) (such as application specific ICs (ASICs) within receivers, transceivers, or the like. Other features, objects and advantages will become apparent from the following detailed description when read in connection with the accompanying drawing in which:

BRIEF DESCRIPTION OF THE SEVERAL

VIEWS OF THE DRAWING

DETAILED DESCRIPTION OF THE INVENTION

Maximum-likelihood decoding of convolutional codes is equivalent to the computation of a shortest path on a particular directed graph called a trellis. A trellis node is labeled with a pair (s,t), where s represents the state of the encoder at time t. An edge (s,t)→(s',t+1) in the trellis represents the transition of the encoder at time t from state (s,t) to state (s',t+1). Each edge (s,t) (s',t+1) in the trellis is labeled with a nonnegative branch metric d, which measures the likelihood that the encoder moves into state s' at time t+1 given that the encoder is in state s at time t and given the received symbol at time t. The branch metrics can be defined in such a way that the sum of the branch metrics on a path is a measure of the likelihood of that path. A trellis contains a distinguished start node at time 0. The accumulated metric of a node is the distance of the node from the start node. The goal of the decoder is to identify, for each time step t, the node at time t with the smallest accumulated metric.

Both the Viterbi decoder and the A* decoder maintain an upper bound to the accumulated metric of all nodes. The basic operation is the expansion of a node. Once the accumulated metric of a node u is known, the upper bound of all its successors is updated. The Viterbi decoder expands nodes breadth-first, and it expands the whole trellis no matter what the noise conditions are. The A* decoder always greedily expands the node with the lowest accumulated metric.

At high SNR, the A* decoder performs far fewer expansions than the Viterbi decoder. However, it is wrong to conclude that the A* decoder is unconditionally better than Viterbi decoder, because in practice, expansion is much cheaper computationally for the Viterbi decoder than it is for the A* decoder. The Viterbi decoder expands every node of the trellis, and consequently it does not incur the overhead of keeping track of which nodes to expand. Moreover, for Viterbi, the order of expansion is known at compile time, which allows for optimizations such as constant folding of memory addresses, efficient pipelining, and elimination of most conditional branches. In contrast, the A* decoder maintains a priority queue of nodes, keyed by accumulated metric.

Such a priority queue slows down practical implementations of the A* decoder because of two reasons. First, for a trellis with n nodes, insertion, deletion and update in a general priority queue requires Θ(log n) operations, which is asymptotically worse than the Θ(1) time per expansion of Viterbi. Second, a general priority queue using heaps or some kind of pointer-based data structure is not amenable to the compile-time optimizations that apply to Viterbi.

Figure 1:
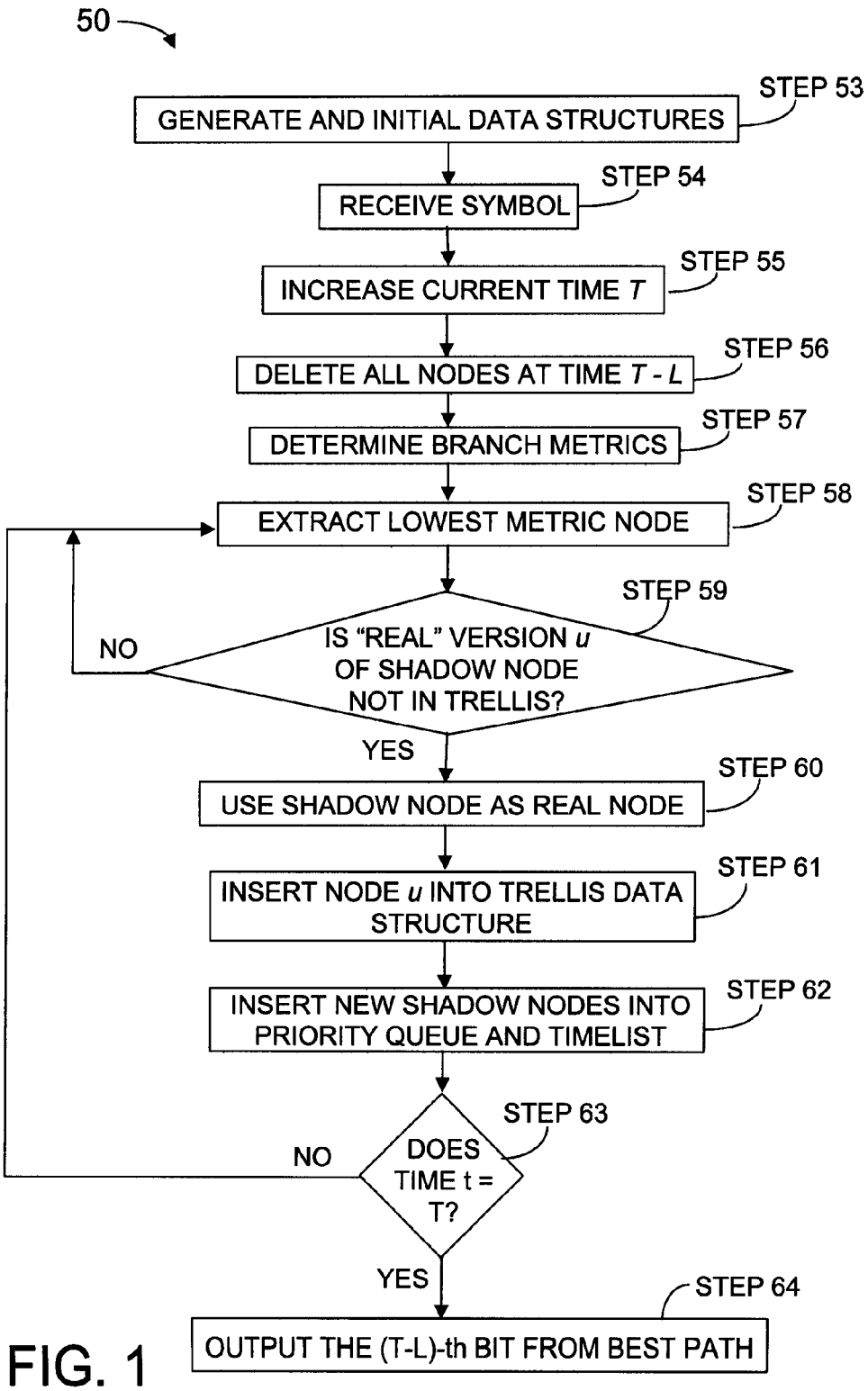
FIG. 1 is a flowchart for decoding a convolutional code.

Referring to FIG. 1, a lazy Viterbi decoder makes the A* decoder approach useful in practice. By exploiting the structural properties of the trellis, all priority-queue operations are performed in constant time, thereby eliminating the Θ(log n) slowdown. A process 50 is an exemplary process for decoding convolutional codes using the lazy Vieterbi decoder.

A careful design of the data structures maintained by the lazy Viterbi decoder allows implementation of the whole expansion operation in constant time, and furthermore, as a short sequence of straight-line code, which is important for efficient pipelining on present-day processors.

The lazy Viterbi decoder maintains two main data structures, called the trellis and the priority queue. The trellis data structure contains the nodes of the trellis graph whose shortest path from the start node has been computed. Each node u in the trellis data structure holds a pointer Prev(u) to its predecessor on the shortest path. The invariant is maintained that every node in the trellis has been expanded.

The priority queue contains a set of shadow nodes. A shadow node û is a proposal to extend a path in the trellis data structure by one step to a new node u. Each shadow node û in the priority queue holds an accumulated metric acc(û) equal to the length of the proposed path extension, and a pointer Prev(û) to the predecessor of u on that path. Nodes û in the queue are keyed by acc(û).

acc(û) is not stored explicitly at û, but rather is implicitly stored by the data structure, a detail described below. The predecessor Prev(û) of a shadow node is a "real" node in the trellis data structure. All nodes in both the priority queue and the trellis also hold their time and state value.

Process 50 initializes (53) the data structures. Initially, the trellis is empty and the queue consists of a shadow ŝ of the start node s with acc(ŝ)=0. Process 50 receives (54) a symbol. Process 50 increases (55) the current time T. Process 50 deletes (56) all nodes at time T−L.

Process 50 determines (57) branch metrics. For example, Let u=(s,t) be a trellis node and let u'=(s',t+1) be a successor of u. In the Viterbi decoder, the branch metric d(u,u') is the conditional log-likelihood of the encoder moving to state s', given a received symbol and given the initial state s of the encoder. The same metric could be employed in the lazy Viterbi decoder, but it turns out that a slight modification of the metric reduces the number of expanded nodes without affecting the performance of the decoder.

Because all edges span consecutive time steps, adding a constant to all branch metrics at time t does not change which path is shortest. In the lazy Viterbi decoder, for each time t a constant h(t) is added to the metric on all branches (s,t)→(s',t+1). The constant h(t) is chosen such that for all t, the minimum branch metric at time t is 0.

To see why such an adjustment of metrics may be desirable, consider the case when all branch metrics at a certain time t are high, possibly because of some noise spike. Without adjustment, the decoder would expand most of the trellis at time earlier than t, without "realizing" that every path going through time t must incur a large penalty eventually. The metric adjustment step avoids this situation by reinterpreting edge metrics as penalties with respect to the best edge at the same time step.

Computing the branch metrics at time t can be done in constant time, since for all edges e at time t, the metric d(e) belongs to a set $M_t$, where $|M_t|$ is a constant that does not depend on the constraint length. Specifically, $|M_t|=2^R$ where R is the number of bits output by the encoder at time t, which depends only on the rate of the convolutional code.

Process 50 repeatedly extracts (58) a shadow node û of minimum metric m from the priority queue. Such a shadow node thus represents the best proposed extension of the trellis. Process 50 determines (59) if u, the "real" version of û with the same time and state, is already in the trellis. If so, then û is discarded, since a better proposal for u was already accepted. Otherwise, process 50 uses (60) the shadow node û as a "real" node. Process 50 inserts (61) a new node u into the trellis with Prev(u)=Prev (û), and, for each successor w of u, process 50 inserts (62) ŵ in the priority queue with metric acc(ŵ)=m+d(u,w). This process is repeated until process 50 determines (63) that the trellis contains a node at time T.

Unlike the A* decoder, in the lazy Viterbi decoder, a node can be both in the trellis and as a shadow in the priority queue. Further, more than one shadow of the same node can be in the priority queue at the same time. This is one of the "lazy" features of the lazy Viterbi decoder. For example, instead of demanding that all nodes be uniquely stored in the system, a test for priority-queue membership is traded for a delayed test for trellis membership. This choice is advantageous because the check can be avoided altogether if a shadow node is still in the priority queue when the decoder terminates. Moreover, trellis membership is easier to test than priority-queue membership, as described below.

The trellis data structure is a sparse matrix. The sparse matrix is called sparse because in practice only a small fraction of the trellis nodes are actually expanded. The sparse matrix is a matrix because the two indices s and t belong to an interval of integers. Many sparse matrix representations (including a dense matrix) could be used to represent the trellis. In one embodiment, the trellis is implemented as a hash table, where the pair (s,t) is the hash key. Using standard techniques, trellis lookup and insertion can be implemented in expected constant time. In alternative embodiments, the "sparse array trick" could be employed for a deterministic O(1) implementation of the trellis.

The priority queue supports two main operations: insertion of a node, and extraction of a node of minimum metric. One embodiment includes an implementation that allows both insertion and extraction in constant time.

The following assumption is made: Branch metrics are integers in the range [0 . . . M], for some integer M independent of the constraint length. This assumption holds for hard-decision decoders, where the branch metric is the Hamming distance between the received symbol and the symbol that should have been transmitted. For soft-decision decoding, this assumption requires quantization of the branch metrics. It is known that quantization to 8 levels is usually sufficient to achieve most of the coding gains, and therefore this assumption is not restrictive.

This assumption allows us to show the following property:

Property 1: At any time during the execution of the lazy decoder, all metrics in the priority queue are in the range [m . . . (m+M)], where m is the minimum metric in the queue.

Proof: The property trivially holds initially, when the priority queue consists of only one node. Whenever a node u gets inserted into the queue, it is the successor of a node with metric m, and so it is inserted with metric acc(u) m+M Since the minimum metric in the queue never decreases, the property always holds.

Based on Property 1, the priority queue is implemented as an array [m . . . m+M] of linked lists of nodes. The metric of a node is not stored in the node, but it is implicitly given by which list the node belongs to. The array can be implemented as a circular buffer of M+1 pointers. Alternatively, one can maintain the invariant that m=0 by periodically adjusting all metrics when the invariant is violated. (This is a simple O(M) operation that only involves a shift of the array.) In either implementation, insertion of a new node and extraction of a minimal-metric node are constant-time operations.

The lazy Viterbi decoder can also process an infinite stream of data. For example, a traceback length L≈5.8 k is fixed. At time T, the decoder processes a new symbol, and expands until the trellis data structure contains a node u at time T. It then outputs its best estimate of the information bit at time T−L by means of a traceback process. The traceback starts at the node u, and follows a path back (using the Pred( ) pointers) until it reaches a node at time T−L. The decoder then outputs the information bit(s) associated with the first transition on the path.

After this procedure, all nodes at time T−L are no longer needed, and the memory that they occupy must be reclaimed. Specifically, all the nodes are deleted from the trellis, and all the shadow nodes from the priority queue, whose time is equal to T−L. To this extent, a linked list of all nodes and shadow nodes at time t are maintained. An array of pointers into such time lists indexed by time is maintained. Since only lists in the range t∈[T−L,T] are nonempty, this array can be managed as a circular buffer of length L+1. After the traceback, proceeding down the time list for T−L, and deleting every node (or shadow node) along the way. Because the trellis is maintained as a hash table, deletion of a node takes constant time or expected constant time, depending on the hashing technique used. Deletion of a shadow node from the priority queue takes constant time if each priority bucket is maintained as a doubly-linked list, a well-known technique.

The running time of the lazy Viterbi decoder applied to stream decoding is not affected asymptotically by the need to maintain the time lists; the time needed to walk down the list can be amortized against the time already taken to create the node (or shadow node). The running time can be affected, however, by the need to perform a traceback. This affect can be minimized by performing a traceback only every B time steps, for some number B, where each traceback outputs the information bits associated with the first B transitions of its path.

Pseudo Code for the Lazy Viterbi Decoder

Below is an exemplary implementation of process 50 using a pseudo code. The entry point of the decoder is the process PROCESS-SYMBOL(x), which is called on each symbol x received from the channel. Line 1 advances the current time T, but, since the decoder only keeps nodes from the last L time steps, time is advanced mod(L). Because of this time periodicity, in line 2 all the nodes are deleted at time T−L from the trellis and from the priority queue. This step uses the time lists described in Section II-C. After these deletions, PROCESS-SYMBOL iteratively adds nodes to the trellis until it adds one with time t =T. At each iteration, the procedure repeatedly calls PQ-EXTRACT-MIN to extract the lowest-metric node û in the queue, until the "real" version u of û is not already in the trellis (this test is performed by the procedure TRELLIS-LOOKUP(û)). Once such a shadow node û is found, it is considered a "real" node u, retaining its place in a time list, and maintaining its Prev pointer. This node, along with its metric m (returned by PQ-EXTRACT-MIN), is passed on to the EXPAND(u,m) procedure.

---

PROCESS-SYMBOL (x):

1 T←T + 1 (mod L);
2 delete nodes at time T−L;
3 COMPUTE-BRANCH-METRICS (X);
4 repeat
5     repeat
6         (û, m) ←PQ-EXTRACT-MIN;
7     until not TRELLIS-LOOKUP (û);
8     Shadow node û is now considered a "real" node u.
9     EXPAND (u, m);

-continued

PROCESS-SYMBOL (x):

10   until time(u) = T;
11   perform traceback, output bit T-L from best path.

The procedure COMPUTE-BRANCH-METRICS(x) operates as described above. Each branch metric $d(u,u')$ for edges at time t is computed using the symbol x received from the channel at time t.

COMPUTE-BRANCH-METRICS (x):

1   S ← set of all branches at time T;
2   for all (u, u') ∈ S, do
3       compute d(u,u') as in Viterbi given symbol x;
4   m ← $\min_{(u,u') \in S}$ d(u, u');
5   for all (u, u') ∈ S, do
6       d(u, u') ← d(u, u') −m.

The EXPAND(u,m) subprocess below inserts the node u into the trellis data structure. For all successors u' of u, a new shadow node û' is created with an appropriate accumulated metric, and with u as their predecessor. These new shadow nodes are then inserted into the priority queue and the time list.

EXPAND (u,m):

1   (s,t) ← u;
2   TRELLIS-INSERT (u);
3       for all successors u' of u, do
4           Generate a shadow node.
5           Prev (û') ← u;
6           acc ← m+ d(u,u');
7           PQ-INSERT((u'),acc);
8           insert u' into Time List(t + 1).

Figure 2:
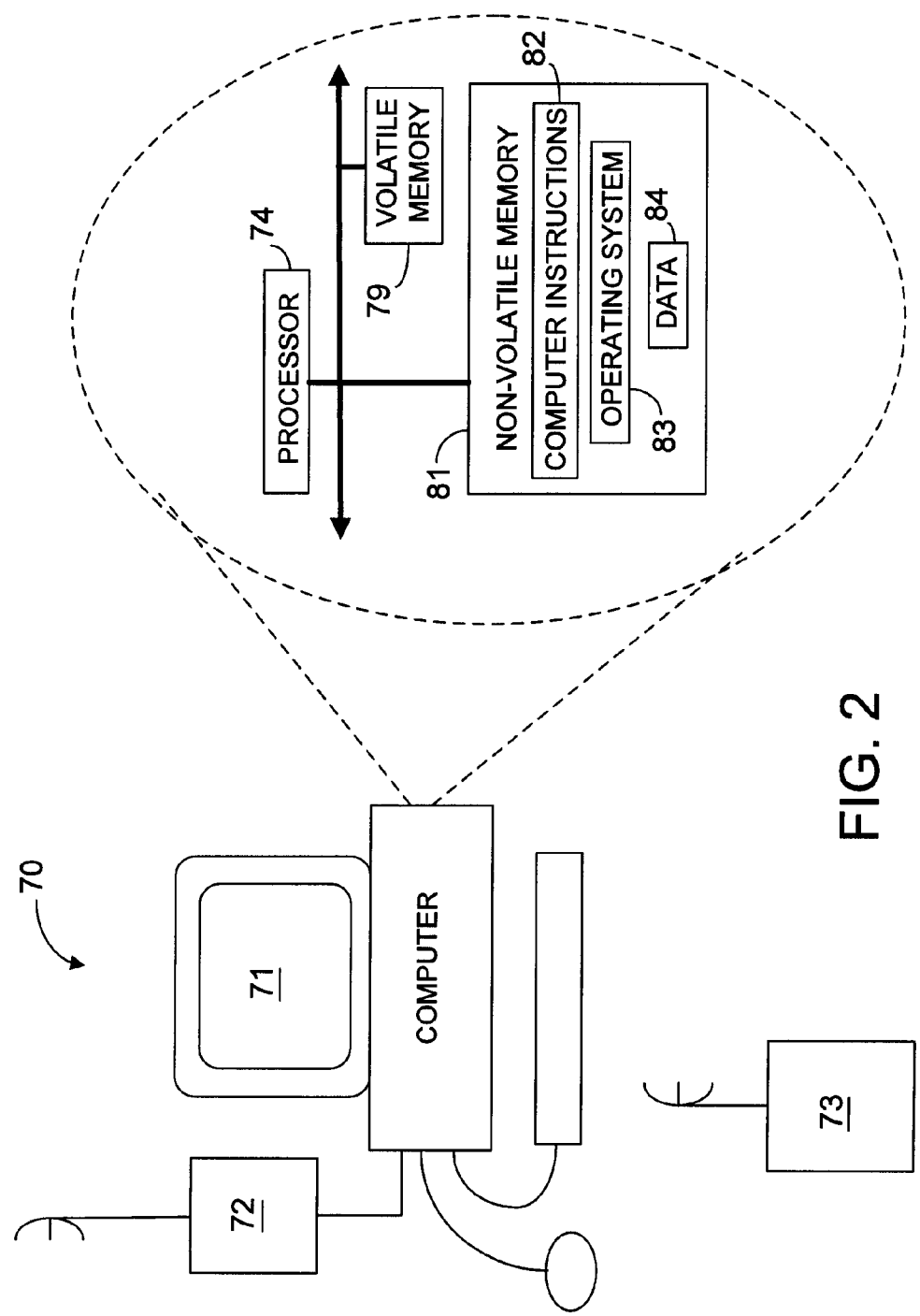
FIG. 2 is a block diagram of a computer system on which the process of FIG. 1 may be implemented.

FIG. 2 shows a decoding system 70 for decoding convolutional codes using process 50 that includes a computer 71, a receiver 72, and a transmitter 73. Computer 71 includes a processor 74 for processing convolutional codes sent from transmitter 73 and received by receiver 72, a volatile memory 79, and a non-volatile memory 81 (e.g., hard disk). Non-volatile memory 81 stores operating system 83, data 84, and computer instructions 82 which are executed by processor 74 out of volatile memory 79 to perform process 50. In one embodiment, computer instructions include executable instruction signals.

Process 50 is not limited to use with the hardware and software of FIG. 2; process 50 may find applicability in any computing or processing environment and with any type of machine that is capable of running a computer program. Process 50 may be implemented in hardware, software, or a combination of the two. Process 50 may be implemented in computer programs executed on programmable computers/ machines that each include a processor, a storage medium/ article of manufacture readable by the processor (including volatile and non-volatile memory and/or storage elements), at least one input device, and one or more output devices. Program code may be applied to data entered using an input device to perform process 50 and to generate output information.

Each such program may be implemented in a high level procedural or objected-oriented programming language to communicate with a computer system. However, the programs can be implemented in assembly or machine language. The language may be a compiled or an interpreted language. Each computer program may be stored on a storage medium (article) or device (e.g., CD-ROM, hard disk, or magnetic diskette) that is readable by a general or special purpose programmable computer for configuring and operating the computer when the storage medium or device is read by the computer to perform process 50. Process 50 may also be implemented as a machine-readable storage medium, configured with a computer program, where upon execution, instructions in the computer program cause the computer to operate in accordance with process 50.

The invention is not limited to the specific embodiments described herein. The invention is not limited to the specific processing order of FIG. 1. Rather, the blocks of FIG. 1 may be re-ordered, as necessary, to achieve the results set forth above.

Other embodiments not described here are also within the scope of the following claims. For example, there has been described novel apparatus and techniques for decoding convolutional codes. It is evident that those skilled in the art may now make numerous modifications and uses of and departures from specific apparatus and techniques herein disclosed without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. A method for decoding convolutional codes, comprising:
   receiving convolutional codes; and
   using a decoder to decode the convolutional codes; wherein using the decoder comprises:
   initializing a trellis data structure and a priority queue data structure;
   extracting a lowest-metric shadow node û in the priority queue until a "real" version u of û is not already in the trellis data structure;
   inserting the node u into the trellis data structure; and
   for all successors u' of u, generating a new shadow node û' with a corresponding accumulated metric; and
   inserting the new shadow node û' into the priority queue and a time list.

2. The method of claim 1, wherein the convolutional codes comprise block convolutional codes.

3. The method of claim 1, wherein the convolutional codes comprise stream convolutional codes.

4. The method of claim 1, wherein the decoder is used in a software radio environment.

5. The method of claim 1, wherein the decoder comprises a lazy Viterbi decoder.

6. Apparatus for decoding convolutional codes, comprising:
   a memory that stores executable instruction signals; and
   a processor that executes the instruction signals to:
   use a decoder; wherein the instructional signals to use the decoder comprise instructional signals to:
   initialize a trellis data structure and a priority queue data structure;
   extract a lowest-metric shadow node û in the priority queue until a "real" version u of û is not already in the trellis data structure;

insert the node u into the trellis data structure; and for all successors u' of u, generate a new shadow node û' with a corresponding accumulated metric; and insert the new shadow node û' into the priority queue and a time list.

7. The apparatus of claim 6, wherein the convolutional codes comprise block convolutional codes.

8. The apparatus of claim 6, wherein the convolutional codes comprise stream convolutional codes.

9. The apparatus of claim 6, wherein the decoder is used in a software radio environment.

10. The apparatus of claim 6, wherein the decoder comprises a lazy Viterbi decoder.

11. An article comprising a machine-readable medium that stores executable instruction signals decoding convolutional codes, the instruction signals causing a machine to:

use a decoding algorithm; wherein instructions causing a machine to use the decoding algorithm comprise instructions causing a machine to:

initialize a trellis data structure and a priority queue data structure;

extract a lowest-metric shadow node û in the priority queue until a "real" version u of û is not already in the trellis data structure;

insert the node u into the trellis data structure; and for all successors u' of u, generate a new shadow node û' with a corresponding accumulated metric; and insert the new shadow node û' into the priority queue and a time list.

12. The article of claim 11, wherein the convolutional codes comprise block convolutional codes.

13. The article of claim 11, wherein the convolutional codes comprise stream convolutional codes.

14. The article of claim 11, wherein the decoder is used in a software radio environment.

15. The article of claim 11, wherein the decoder comprises a lazy Viterbi decoder.

16. A receiver, comprising:

a decoder configured to:

initialize a trellis data structure and a priority queue data structure;

extract a lowest-metric shadow node û in the priority queue until a "real" version u of û is not already in the trellis data structure;

insert the node u into the trellis data structure; and for all successors u' of u, generate a new shadow node û' with a corresponding accumulated metric; and insert the new shadow node û' into the priority queue and a time list.

17. The receiver of claim 16, wherein the receiver is in a software radio environment.

18. The receiver of claim 16, wherein the receiver is in a high-definition television.

19. The receiver of claim 16, further comprising a transceiver, wherein the transceiver comprises the receiver.

20. The receiver of claim 16, further comprising an integrated circuit; wherein the integrated circuit comprises the decoder.

21. The receiver of claim 16, wherein the decoder comprises a lazy Viterbi decoder.

* * * * *